United States Patent [19]
Bennett et al.

[11] Patent Number: 5,367,139
[45] Date of Patent: Nov. 22, 1994

[54] METHODS AND APPARATUS FOR CONTAMINATION CONTROL IN PLASMA PROCESSING

[75] Inventors: Reid S. Bennett, Wappingers Falls, N.Y.; Albert R. Ellingboe, Palo Alto, Calif.; George G. Gifford, Croton-on-Hudson; Kurt L. Haller, Peekskill, both of N.Y.; John S. McKillop, Satellite Beach, Fla.; Gary S. Selwyn; Jyothi Singh, both of Hopewell Junction, N.Y.

[73] Assignee: International Business Machines Corporation, Armonk, N.Y.

[21] Appl. No.: 425,659

[22] Filed: Oct. 23, 1989

[51] Int. Cl.$^5$ .............................................. B23K 9/00
[52] U.S. Cl. ...................... 219/121.59; 219/121.41; 219/121.43; 156/345; 204/298.31
[58] Field of Search ..................... 219/121.43, 121.44, 219/121.45; 315/111.51, 111.21; 156/643, 646, 345; 204/298.37, 298.38, 307, 298.01, DIG. 11

[56] References Cited

U.S. PATENT DOCUMENTS

| | | | |
|---|---|---|---|
| 4,401,507 | 8/1983 | Engle | 219/121.43 |
| 4,475,921 | 10/1984 | Barmatz | 23/313 |
| 4,500,563 | 2/1985 | Ellenberger | 427/38 |
| 4,657,616 | 4/1987 | Benzing et al. | 156/345 |
| 4,698,130 | 10/1987 | Restall et al. | 156/345 |
| 4,786,352 | 11/1988 | Benzing | 156/345 |
| 4,795,880 | 1/1989 | Hayes et al. | 156/345 |
| 4,816,113 | 3/1989 | Yamazaki | 156/345 |
| 4,927,485 | 5/1990 | Cheng et al. | 156/345 |
| 4,960,488 | 10/1990 | Law | 156/643 |

FOREIGN PATENT DOCUMENTS

| | | |
|---|---|---|
| 0139835 | 6/1984 | European Pat. Off. . |
| 59-76874 | 2/1984 | Japan . |
| 62-83465 | 7/1985 | Japan . |

OTHER PUBLICATIONS

IBM Technical Disclosure Bulletin, entitled "Removing Quartz Flakes From Surfaces by Sound Energy", by Hafner, et al., vol. 17, No. 2 Jul. 1974, p. 452.

Journal of Vacuum Science and Technology: Part A, entitled in "In Situ Laser Diagnostic Studies of Plasma-Generated Particulate Contamination", by Selwyn, et al., vol. 4, No. 4, Jul. 1989, pp. 2758-2765.

In situ laser diagnostic studies of plasma-generated particulate contamination by G. S. Selwyn J. Vac. Sci. Technol. A7(4) Jul./Aug. 1989, pp. 2758-2765.

Spatial dependence of particle light scattering in an rf silane discharge by R. M. Roth, K. G. Spears, G. D., Stein and G. Wong Appl. Phys. Lett. 46(3), 1 Feb. 1985, pp. 253-255.

Detection of Cl and chlorine-containing negative ions in rf plasmas by two-photon laser-induced fluorescence by G. S. Selwyn, Appl. Phys. Lett. 51(12), 21 Sep. 1987 pp. 898-900.

Primary Examiner—Mark H. Paschall
Attorney, Agent, or Firm—Michael J. Balconi-Lamica; Graham S. Jones, II

[57] ABSTRACT

Contamination levels in plasma processes are reduced during plasma processing, by prevention of formation of particles, by preventing entry of particles externally introduced or by removing particles spontaneously formed from chemical and/or mechanical sources. Some techniques for prevention of formation of particles include interruption of the plasma by pulsing the source of plasma energy periodically, or application of energy to provide mechanical agitation such as mechanical shockwaves, acoustic stress, ultrasonic stress, vibrational stress, thermal stress, and pressure stress. Following a period of applied stress, a tool is pumped out (if a plasma is used, the glow is first discontinued), vented, opened and flaked or particulate material is cleaned from the lower electrode and other surfaces. A burst of filtered air or nitrogen, or a vacuum cleaner is used for removal of deposition debris while the vented tool is open.

32 Claims, 5 Drawing Sheets

METHODS AND APPARATUS FOR CONTAMINATION CONTROL IN PLASMA PROCESSING

BACKGROUND OF THE INVENTION

1. Field of the Invention

This invention relates to apparatus and processes for reducing particulate contamination in plasmas.

2. Description of Related Art

Problems in the Art and Related Art

Effectiveness of plasma etching in semiconductor device fabrication has been reduced by contamination problems.

Particulate contamination is a major problem encountered during plasma processing of microelectronic materials. By some accounts, 50% of current semiconductor chip yield loss may be attributed to direct or indirect effects of particulate contamination during fabrication. This fraction is expected to increase as device dimensions are reduced in future technologies. Particles that reduce process yields today range in size from the macroscopic to the sub-micron size.

Particulate contamination also has an extremely deleterious effect on the performance and reliability of microelectronic devices produced by plasma etching or deposition. Particulate contamination can result in device failure, poor film quality, changes in material resistivity, and impurity permeation. Further, as device dimensions are reduced, tighter control of the etching profile requires ever more stringent restrictions on the allowable particle contamination number, density, and size. To meet these requirements, tightly controlled, clean rooms are required to avoid particle deposition on product surfaces during wafer transport and handling.

Improvements in clean room technology and in the handling of in-process substrates (for semiconductors and other applications) have reduced the once appreciable introduction of particulates onto substrates during non-process exposure such as wafer handling and transfer. Particulate formation during process steps, including plasma processing, may now contribute a significant fraction of total contamination exposure with corresponding yield reduction. G. S. Selwyn, R. S. Bennett and J. Singh, "In-situ Laser Diagnostic Measurements of Plasma-Generated Particulate Contamination in RF Plasmas" J. Vac. Sci. Tech. A. Vol. 7 (4), pp2758–2765 (July/August 1989).

In addition, the industry trend is towards "integrated vacuum processing", or "multi-chamber processing". This means that surface contamination previously removed by wet or dry mechanical means will be more complex or impossible to remedy since it now requires removal of the substrate from the vacuum chamber. In multi-chamber tools, particulates which drop onto a wafer before, during, or at the completion of a process step may have an especially severe impact on subsequent process steps in that tool.

Recent studies in our laboratory have shown that certain etching plasmas can produce particulates which may be a significant source of product contamination and device failure. These experiments have shown that particles can be nucleated, grown, and suspended in a process plasma until they are significant in size. For example, particles are formed with sizes on the order of the submicron scale to hundreds of microns in diameter. The problem is that the particles ultimately fall onto devices being fabricated in the same manufacturing environment. If particles fall before or during film deposition or pattern transfer, then they can disrupt the process step. If they fall at the end of a process step, the particulates may disrupt subsequent process steps. These contaminants often produce defects which affect the device yield, performance and reliability. Similar results have been observed in deposition type plasmas (PECVD Silane), see R. M. Roth, K. G. Spears, G. D. Stein and G. Wong "Spatial Dependence of Particle Light Scattering in an RF Silane Discharge" App. Phys. Lett., 46 (3), 253–255 (1985)).

The effects of particulate contamination can be magnified when selective plasma etching processes are used. Certain plasma etching processes rely on a combination of feed gases and etching conditions to etch material surfaces on the wafer selectively. The chemical formation of particulates which are etched at a slow rate in these highly selective plasmas results in micromasking, or an irregular surface often referred to as "grass". This spike or hill of unetched material will also degrade the device performance and reduce process yield.

Contrary to common belief, presence of these particulates is not always due to material flaking from chamber walls, but may also be due to gas phase processes such as homogeneous nucleation. This suggests that particle contamination problems may not be eliminated solely by rigorous attention to clean room techniques and frequent cleaning of manufacturing equipment. Instead, since the plasma itself can result in product contamination, this problem may pose a "base level" of contamination even with the highest clean room technology. It is therefore important to develop means to operate the plasma while controlling or eliminating particle formation. Further, techniques are also necessary for removing particles, once present in a process.

Postulated Mechanism of Particle Formation

Laser-light scattering studies in our laboratory have indicated that the plasma composition and gas flow have a pronounced effect on the formation of particle contamination in etching plasmas. In particular, faster gas flow resulting in shorter residence time in the plasma as well as lower gas pressures and shorter plasma exposure, all tend to inhibit particle formation in certain plasmas. This suggests a mechanism of nucleation and growth for particle production. Feed gas chemistry also has an important effect on particle formation. Chlorine-containing plasmas are highly prone to particle formation, although non-chlorine plasmas, such as $CF_4$, can produce particles on a smaller scale. Most important, however, has been the discovery by spatially-resolved laser light scattering experiments, that particle growth occurs initially in the region just above the sheath boundary, and may be confined to a vertical region of less than 1 mm thick.

This same region has been shown experimentally to trap plasma negative ions, resulting in a high concentration of plasma negative ions in this region as explained by the reference, G. S. Selwyn, L. D. Baston and H. H. Sawin, "Detection of Cl and Chlorine-containing Negative Ions in RF Plasmas by Two-photon Laser-induced Fluorescence" Appl. Phys. Lett., 51 (12), 898–900 (1987). It has been explained theoretically by the reference: M. S. Barnes, T. J. Colter and M. E. Elta, "Large-signal Time-domain Modeling of Low-Pressure RF Glow Discharges" J. Appl. Phys., 61(1), 81 (1987).

Wave Induction aspect of the Invention

Previously published work on etching includes G. S. Selwyn, R. S. Bennett and J. Singh, "In-situ Laser Diagnostic Measurements of Plasma-Generated Particulate Contamination in RF Plasmas," above. A work on deposition is K. G. Spears, T. M. Robinson and R. M. Roth, "Particle Distributions and Laser-Particle Interactions in an RF Discharge of Silane" IEEE Trans. Plasma Science, PS-14, 179–187 (1986). The above work on etching and deposition plasmas has indicated that particles formed in plasmas tend to be suspended at the plasma/sheath boundaries. This phenomenon is attributed to negative charging of particulates in the plasma and has recently been modelled. Studies in our laboratory of sputtering plasmas have shown similar particle suspension albeit without particle growth.

SUMMARY OF THE INVENTION

The present invention is directed to a new and improved method of prevention of plasma contamination in a plasma reactor system comprising applying electrostatic, electromagnetic, mechanical, thermal, pressure, hygroscopic or chemical means to eliminate particle contamination in situ in said plasma reactor system, as well as corresponding apparatus.

Preferably this method as well as the corresponding apparatus includes performing a plasma process including the steps as follows: a) applying an RF voltage to establish a plasma within the reactor, b) periodically interrupting the RF voltage for a brief interval and reestablishing the RF voltage after the brief interval, providing a series of momentary interruptions of the RF voltage and the plasma periodically, between longer periods of time during which the RF voltage is applied causing the plasma to be applied in the reactor during the longer periods, and c) continuously repeating the application of the RF voltage to the reactor interrupted by the brief intervals of interruption of the RF voltage until the completion of the plasma process.

Forces are applied within the reactor for moving particles potentially leading to contamination across the plasma reactor. The particles are moved to a space separate from the active region of the reactor to reduce contamination within the active region of the reactor.

Particle contamination is moved across the plasma reactor by the use of a directed electromagnetic wave or by the use of standing waves. The standing waves can be electromagnetic waves. Preferably the standing electromagnetic waves can have a controllable phase shift, and they can comprise a microwave field having a controllable phase shift from opposite regions of the reactor.

Particle contamination can be moved across a plasma reactor to reduce contamination by the use of a pulsed, continuous or ramped magnetic field, or a directed acoustic wave, or a standing acoustic wave, or an acoustic wave generated by a transducer.

Alternatively, particle contamination can be moved across a plasma reactor to reduce contamination by the use of an acoustic wave generated by a pulsed gas flux in the tool, or by standing acoustic wave generated by two transducers located on opposite sides of the reactor.

Particle contamination can also be moved across the plasma reactor to reduce contamination by the use of particle beams, or by the use of electromagnetic radiation pressure, such as where the electromagnetic radiation pressure comprises light from lasers or incoherent light sources.

Particle contamination is moved across the plasma reactor to reduce contamination by the use of a thermal gradient.

A method of applying a directed energy field to a plasma results in time-averaged movement of charged or neutral particulates. This method can be achieved by apparatus for removing particulates from a chamber comprising a reactor means, means for providing a plasma in the reactor means, and means for applying a directed energy field to the plasma, whereby time-averaged movement of charged or neutral particulates is achieved.

Stress is applied to the plasma reactor to remove the particles from the reactor walls and electrode surfaces.

The stress comprises an energy field mechanically agitating the reactor to transfer energy to the particles, whereby the particles are prepared for removal from the reactor.

The stress can comprise a mechanical shockwave, an acoustic stress, an ultrasonic stress, a vibrational stress, a thermal stress, or a pressure stress.

The invention further comprises a method for performing a plasma process including the steps as follows: a) loading a work piece into an RF plasma chamber, b) applying an RF voltage to establish a plasma within the chamber, the plasma being exposed to the work piece to perform a plasma process upon at least one surface of the work piece, c) periodically interrupting the RF voltage for a brief interval and reestablishing the RF voltage after the brief interval, providing a series of momentary interruptions of the RF voltage and the plasma periodically, between longer periods of time during which the RF voltage is applied causing the plasma to be applied to the work piece during the longer periods, and d) continuously repeating the application of the RF voltage to the chamber interrupted by the brief intervals of interruption of the RF voltage until the completion of the plasma process.

Another aspect of this invention includes a method of removing contamination from a plasma reactor comprising removing a deposit layer on an inner surface of the reactor comprising contamination within a plasma reactor by application to the chamber of an external stress, at a time between successive times of operation of the plasma within the reactor, the applied stress being sufficient to cause fracture of the deposit layer on the surfaces of the chamber and to cause flakes or particles to be loosened from the surfaces.

Reduction of particulate contamination in process plasmas is promoted by addition of trace amounts of a fluorinated feed gas such as $CF_4$ or $NF_3$ feed gas.

Also, the quantities of water, oxygen or absorbed organic chemicals are reduced from the interiors of the reactor with a pre-process plasma exposure with a reactive gas.

Pre-process exposure of $CF_4$ or $NF_3$ plasmas causes a reduction in the water, oxygen or absorbed organic chemicals from the interiors of plasma chambers.

Reduction of water content of process feed gas is achieved by the use of a hygroscopic filter prior to entry of the feed gas into the process chamber.

Water content of process feed gas is reduced by the use of a silica gel filter prior to entering the process chamber.

Water content of process feed gas is reduced by the mixture of small amounts of $SiF_4$ with the process gases, before the silica gel filter prior to entering the process chamber.

Alternatively, a mixture of small amounts of $SiF_4$ with the process gases is mixed into the feed gas in the presence of an inductive plasma in the silica gel filter prior to introduction of the feed gases into the processing chamber, whereby the water and hydrogenous material content of the feed gas is reduced.

The present invention further includes the steps of exposing the reactor to a coherent light source for producing in situ light scattering in the reactor, and detecting the light scattering within the reactor, whereby contamination inside the reactor can be measured by analyzing the light scattering.

Preferably the coherent light source comprises a HeNe laser or a diode laser. Video signals are produced from the results of the step (b) of detecting light scattering by employing video circuitry to detect contamination as indicated by the data signals from step b.

The present invention also includes means for performing all of the functions described above which are implicit in this application. Their restatement here is omitted to avoid prolixity.

BRIEF DESCRIPTION OF THE DRAWINGS

FIGS. 1 and 2 show a system for employing wave induction control for removing particles from the plasma regions within a plasma reactor chamber.

FIGS. 6 and 7 show plasma reactor systems employing the acoustic stress approach wherein the tools are subjected to acoustic frequencies from an acoustic transducer applied internally within the chamber walls of the tool or externally from the exterior of chamber wall of a plasma processing tool.

The forgoing and other objects, features and advantages of the invention will be apparent from the more particular description of the preferred embodiments of the invention which follows.

DESCRIPTION OF THE PREFERRED EMBODIMENTS

Particle Formation in Plasma Process Tools

We have discovered several sources of contamination in process plasmas. In certain etching plasmas, particulates and particles are produced by a gas phase process known as "homogeneous nucleation," and may be initiated by a localized concentration of plasma negative ions. The hypothesis supported by experimental data is that the trapping of negative ions formed in the plasma above the sheath boundary causes formation of particles which precipitate onto the wafer.

These ions generally have no primary role in etching plasmas, because they are electrostatically repelled from the electrodes, wafers, and chamber walls. It is postulated that the electric field which traps the negative ions, also prevents their loss due to diffusion or gas flow. Other species (probably neutral components) may attach to the negative ions by ion/induced-dipole attraction, and the negative charge of these growing clusters continues to bind them to the region above the sheath boundary. In time, these clusters continue to grow to macroscopic sizes, until the RF field is turned off when they drop down by gravity onto the wafer surface. Some particles may be neutralized by collision with plasma positive ions, and drop down during plasma exposure. While the exact mechanism of particle formation is unclear, it is clear, however, from experimental evidence, that the particles are charged and electrostatically suspended near the plasma sheath boundary. The inventors believe that, by analogy, it also appears likely that negative ions may act as "seeds" for particle formation since a close correlation is observed between conditions that favor negative ion formation and conditions which induce particle growth.

Applicants propose a mechanism for homogeneous nucleation as summarized below:
1. Etch products accumulate in plasma, resulting in negative ion formation.
2. Plasma negative ions are trapped by electrostatic forces at the sheath boundary.
3. Clustering of negative ions with plasma neutrals or ions results in growth, eventually forming charged particles.
4. Charged particulates remain trapped at the plasma sheath boundary. Some particulates are neutralized and drop onto the wafer.
5. Trapped charged particles drop onto the wafer when the plasma is turned off, resulting in contamination of the surface.

We have also discovered that if ultra-small particulates are in some way injected into the plasma, they may behave as nucleation sites for particle growth. The presence of nucleation sites acts to accelerate the formation of macroscopic particles. To continue the analogy given above, injection of nucleation sites into the plasma acts much like transplanting a seedling into a garden. It results in faster growth relative to the seed. Like particulates formed from homogeneous nucleation, particles grown from nucleation sites also become negatively charged in the plasma and so those particulates are electrostatically suspended at the sheath boundary.

One particular source of injected particles is the process by-product film formed during sputter, deposition, or even etching processes, with which tool surfaces are typically coated by the target material and/or process by-products. Following completion of the process, the wafers or substrates are removed. For reasons of economy and convenience, the tool is frequently used again for the next batch of wafers, often with only a cursory cleaning between runs. Over a period of time, deposits of such materials can build up and become an internal source of contamination. Electrode arcing, thermal cycles and mechanical motion all may induce stress into the tool deposition film and may result in flaking or spalation of deposit material. These flakes may severely contaminate product wafers even without a growth step in the plasma, and cause associated device problems such as yield loss, or reduced circuit reliability. It is highly desirable to have a means for rapid removal of this deposition layer between runs, or at the very least, a means to remove the flakes most likely to drop during subsequent use of the tool.

To avoid particulate contamination problems in a plasma, we have discovered that it is therefore important to inhibit homogeneous nucleation and at the same time, to avoid introduction or production of nucleation sites, e.g. particles from the tool wall deposit into the plasma.

We have discovered four methods for inhibiting particulate contamination during plasma processing in accordance with this invention. Those methods are as follows:

1) Reduce negative ion formation since these may be the precursors for particle formation by homogeneous nucleation;
2) Sweep away, trap or getter the particles after their formation or prevent them from dropping onto the wafer surface;
3) Abort the growth or accumulation of negative ions;
4) Reduce the introduction of nucleation sites into the plasma by chemical or physical means.

In individual situations, one or more methods may be more preferable than the other methods because of constraints on the process, equipment, or other manufacturing concerns.

Background on these techniques is given below:

Method 1

Reduce negative ion formation

The first method is most direct because it stops the nucleation of particles directly. But, since the most common method of changing the formation of negative ions in a plasma is by changing the feed gas composition, this is likely to have a significant effect on the performance of the process step, such as etch rate, selectivity or ion damage to the device or workpiece. In fact, we have demonstrated the success of this method simply by substituting neon for argon in a 90% Ar/10% $CCl_2F_2$ plasma ($CCl_2F_2$ is sold under the trade name Freon 12 referred to as FR12). The Ar/FR12 (Argon/-Freon12) plasma showed large amounts of particle formation whereas a Ne/FR12 plasma under the same conditions showed almost no detectable particle contamination. Selection of plasma chemistry can greatly alter the balance between plasma negative charge carriers (electrons or negative ions) and thereby influence the availability of precursor negative ions for particle growth. In particular, experiments have indicated that addition of a small amount (5%) of $CF_4$ to a $CCl_2F_2$ plasma is highly effective in reducing particle contamination counts. Addition of small percentages of fluorine-containing feedgas to a chlorine-rich plasma is effective in reducing particle contamination by altering the balance between chlorine- and fluorine- containing etch products. This in turn changes the balance between negative ions and electrons (interfering with step 1 in the above mechanism). Although use of these methods is made used to improve particle contamination problems, unless done as suggested below under method 4, with reference to FIGS. 8 and 9 feedgas compositional changes may have other unwanted effects on the process step, so this method may not be a generally acceptable solution to particle contamination problems.

By applying an external energy source, such as a UV Laser Beam, to the trapping region for negative ions, it is possible to alter the balance between negative ions and electrons by a photodetachment processes. Experiments have indicated that prolonged exposure of a high power UV laser to the trapping region can prevent the formation of charged particles. As an alternative, electrostatic or magnetic fields may be applied to dislodge the charged particles from the trapping region of the plasma. These fields may be applied continuously during the process or may be applied at the completion of the process as the plasma field is extinguished. This method interferes with steps 4 & 5 in the above mechanism.

Method 2

Sweep away, trap or getter the particles after formation to prevent them from dropping onto the wafer surface During plasma processing, particles may be present due to chemical and/or mechanical sources. The latter represents contamination resulting from the injection of nucleation sites into the plasma. These nucleation sites may provide enhanced opportunity for particle growth in the plasma.

Chemical sources result from the interaction of gas phase etch products or reactants with charged or neutral components of the plasma. Such particles will often show size growth with increasing exposure time to the plasma.

One method of reducing problems associate with particulate contamination during plasma processing is to prevent electrostatically-suspended particles from dropping onto the wafer. This method is effective against particles formed by homogeneous nucleation as well as against particles grown from the injection of nucleation sites into the plasma. Accordingly, this method is more general in application, but also requires changes to existing tooling equipment.

Because many of the contamination particles are electrostatically suspended in the plasma, it is possible to prevent these particles from dropping onto the wafer(s) below through the application of a force, such that the particles are swept away, trapped, or "gettered" to a region of the process chamber where they will not affect product materials. That is, the particles are trapped in a chamber or adsorbed away from the reactive atmosphere in the reactor chamber.

The term "getter" refers to removal of the particles from the system by means of a getter such as an electrostatically charged wire.

This method of gettering particles or preventing them from dropping onto the wafer, may also present problems because it requires substantial changes to existing tooling. Further, electrostatic methods for repelling charged particles may alter the plasma characteristics, pose safety problems or even aggravate particle contamination problems by attracting other charged species. Placing the product surface on the upper electrode would avoid some particle contamination, but it would also require major redesign of equipment and may be only partially effective in avoiding attraction of particles to the wafer.

Figure 1:
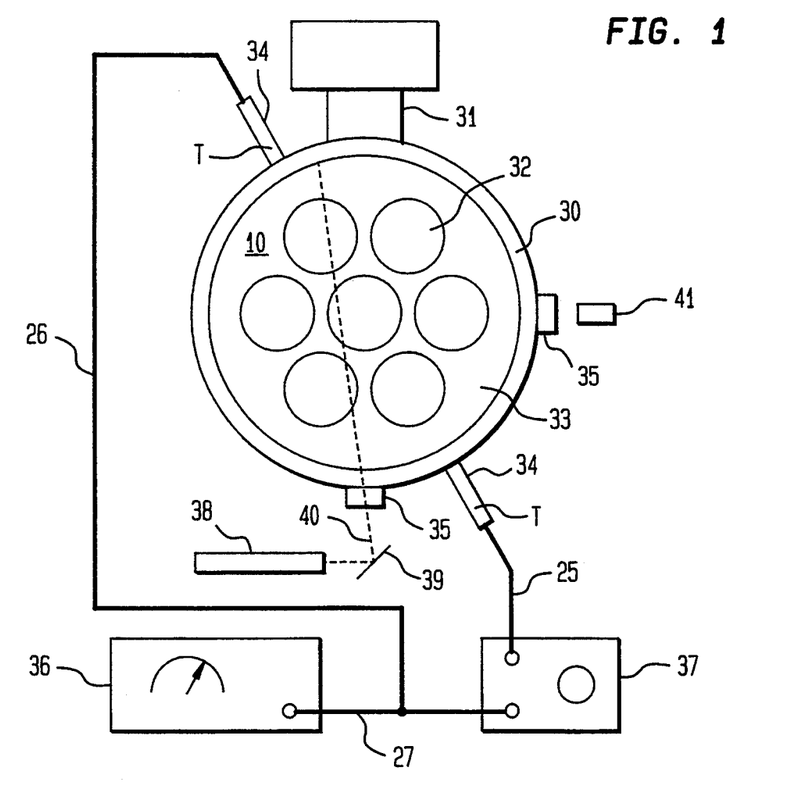
Figure 2:
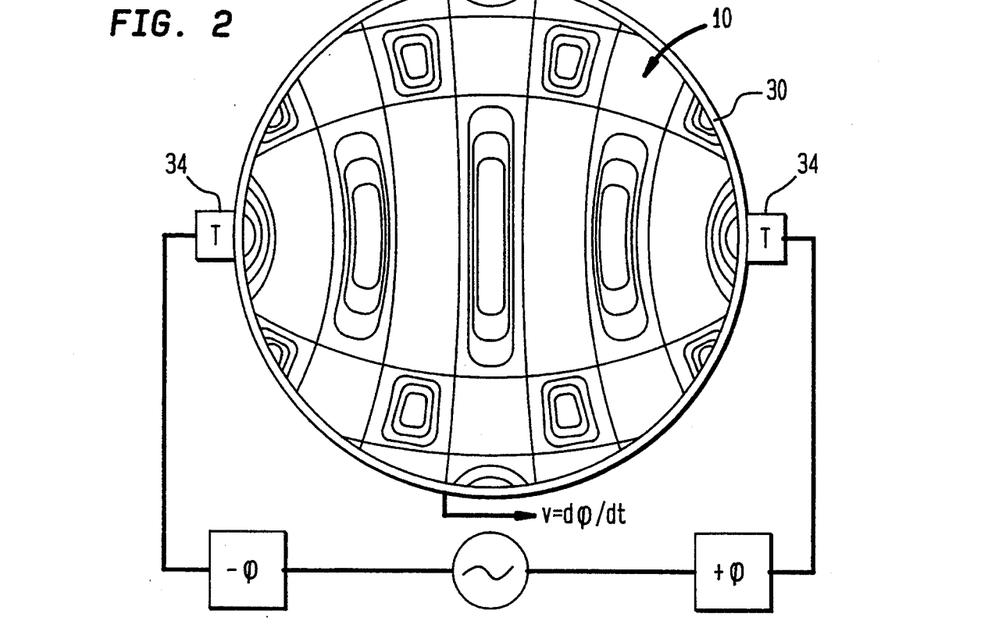
FIG. 2 is apparatus for contamination control by electromagnetic (EM) or acoustic (A) wave induction

We have discovered a method of "sweeping" particles out of a plasma by the application of a lateral wave induction force across the plasma discharge. This method of wave induction control is illustrated by FIGS. 1 and 2. FIGS. 1 and 2 show apparatus for contamination control by electromagnetic (EM) or acoustic (A) wave induction. Wave transducers 34, denoted by T, can be sources of cylindrically symmetric wavefronts or EM waves illustrated by the patterns within a plasma reactor chamber 10 in FIG. 2. If so, transducers 34 may be microwave antennas for producing electromagnetic (EM) waves in the plasma in reactor chamber 10. For acoustic (A) waves, piezoelectric transducers are used as transducers T 34 producing acoustic (A) waves in the plasma in reactor chamber 10. The nodes of the resting standing wave pattern in the plasma reactor chamber 10 are outlined by grid lines in FIG. 2. Contour lines are shown in regions of positive amplitude at an arbitrary time; the amplitude oscillates at the fundamental frequency of the EM or A wave. Arbitrarily slow movement of the vertical nodal lines is effected by shifting the phase of the radiated waves by equal but opposite values, providing the proper force necessary for moving particles trapped at the nodes to one side of the chamber, as is discussed for each type of standing wave, as described below.

The plasma reactor chamber 10 housed by wall 30 is connected as shown in FIG. 2 to a vacuum throat 31, as is well known by those skilled in the plasma processing art. Chamber 10 contains wafers 32 resting parallel to electrode 33 shown in plan view in FIG. 1. This wave induction force has the effect of "sweeping" any particles away from the critical regions of the tool, above the wafers 32, and into noncritical regions such as the the vacuum manifold or edges of the tool. It should be noted that simple application of a continuous electric field may be effective for directing charged particles, but would unavoidably also have significant effects on the plasma uniformity, and so would be undesirable from a process viewpoint. In addition, the application of a continuous electric field would have the greatest effect on charged, low mass components in the plasma, such as ions and electrons. The techniques described here have minimal, if any, effect on the plasma uniformity and yet are effective for sweeping out particles from the critical regions of the tool. This method is effective on particulates resulting from chemical and/or mechanical sources in the plasma. As such, this should prove a powerful contamination control strategy. Together with the interruption technique of FIGS. 3 and 4, these are methods for active contamination control in a plasma process.

A key feature of this aspect of the invention is the induction of a lateral wave during processing. Particles which are charged and electrostatically suspended in a discharge within chamber 10 (and even particles not charged or suspended) will be directed by wave motion in loose analogy to a surfboard carried by ocean waves. In addition, since conditions (such as the frequency and amplitude) of the waves will be matched to the large mass of the particle relative to the much lighter gaseous components of the plasma, the induction of this wave should not alter the time-averaged spatial density or composition of the plasma. In this way, the spatial uniformity of plasma for etch or deposition processes will be unaffected. The invention functions to sweep any suspended particles away from the useful regions of the plasma and into a region where they will not impact electronic substrates 32 when they drop out of suspension in the plasma.

Three techniques are proposed for providing radial waves across the plasma tool, described below, are as follows:

1. Electromagnetic Standing Wave Oscillation
2. Acoustic Wave
3. Radiation Pressure 1. Electromagnetic Standing Wave Oscillation This method for particle removal relies upon externally applied electromagnetic radiation to set up a standing electromagnetic wave which is gently swept through the plasma within chamber 10 surrounded by wall 30 and which thus removes any electrostatically charged particles suspended in the plasma. One example of such a system employs a single microwave source to drive two separate microwave antennas 34 located on opposite sides of the plasma processing tool as shown schematically in FIGS. 1 and 2. This results in a standing wave pattern due to interference between the two sources. The interference of the two microwave fields emitted by these antennas 34 creates alternating zones of high and low microwave intensity spatially separated by a few centimeters. Weak absorption of the microwave radiation by plasma electrons then result in localized areas of slightly higher (or lower) plasma potential due to the modified local ionization rate resulting from this absorption. The spatial variation in microwave field intensity is thus translated, via electron absorption and other processes, into a spatial variation in floating potential which is capable of providing directional acceleration to charged particles in the plasma.

Movement of the location of the maxima and minima in the microwave interference can be achieved simply by variation of the phase of the wavelength transmitted by one antenna relative to the second antenna. As this phase changes through a period of $2\pi$ the variation in local plasma potential will sweep through a region equal in length to the wavelength of the microwave radiation, about 7 cm at 2.45 GHz, for example. This sweeping plasma potential will provide an electrostatic force to all charged particles in the plasma which will force them to the edges of the apparatus and thus prevent them from contaminating product wafers in the center of the plasma tool within chamber wall 30.

Referring to FIG. 1, one microwave antenna 34 is connected by wire 25 to one terminal of phase-shifter 37. The other antenna 34 is connected by wire 26 to the other end of phase shifter 37 and by to wire 27 to an oscillator 36. A laser 38 produces a laser beam 40 which is scanned by a conventional motor driven scannably mounted mirror 39 through port 35 in chamber wall 30 to scan the interior of the plasma processing tool within chamber wall 30. A detector 41 is juxtaposed to a second view port 35 to employ the laser light scattering from laser beam 40 and as detected by detector 41 to determine the effectiveness of wave induction, and to determine when the tool is sufficiently clean for manufacturing use.

Only low levels of microwave radiation are required to produce the spatial variation in plasma potential needed to sweep particles out of the reactor space inside the chamber wall 30. The time-averaged microwave field at any point in the reactor will also be quite uniform, so that variations in process uniformity introduced by this technique is minimal.

A ramped magnetic field can also be employed to promote radial acceleration of charged particulates. This may be applied continuously (with enhancement to the plasma), or in a pulsed fashion to result in minimal distortion to the process.

2. Acoustic Wave

We have found two acoustic methods of particulate gettering, which are effective on charged particles, as well as, any neutral particles that may exist in a particular process plasma.

Radial Pressure Wave

The first acoustic method relies on the transduction of a pressure wave within the chamber wall 30 in FIG. 2, accomplished by any of several types of transducers, i.e. devices, including, but not limited to, acoustic transducers such as loudspeakers, piezoelectric elements, and transducers producing pulsed gas flow passed through an appropriately shaped orifice. The particles experience a force in the direction of propagation arising from the pressure gradient of the radial pressure wave. The wavelength is chosen to optimize this force for a specific particulate mass distribution such that the particles move across the plasma analogously to tidal movement or the movement of driftwood by ocean waves.

The site of the transducer causing the wave transduction may be to one side of the chamber wall 30, in which case the wave energy causes the particles to gather on the opposite side of the chamber wall 30 from the transducer. If the transducer site is located at the the center of a cylindrical space defined by chamber wall 30, then the pressure wave will moves radially outward in all directions, much like the ripples on a smooth pond after a small stone is dropped in, and the particles thus gather equally around the edges.

Alternative locations of the transducers will produce predictable variations in the action upon particles.

Acoustic Standing Wave Oscillation

The second acoustic method is similar in concept to the standing-wave technique disclosed for electromagnetic waves, and thus convenient acoustic frequencies may be used that do not necessarily meet the criteria described above for directly moving the particles. As illustrated in FIG. 2, two acoustic transducers 34 of a type described above are arrayed on opposite sides of the chamber wall 30. The transducers 34 are driven at the same frequency, creating a standing wave in the plasma. The anti-nodes of the standing wave undergo cyclic compression and rarefaction at the acoustic frequency. Suspended particles are thus moved by the transient pressure gradients to regions of constant pressure, i.e. the nodes of the standing wave. By continuously advancing the phase of the AC source driving one of the transducers, and retarding the phase of the other by the same amount, the nodes of the standing wave move with respect to the chamber. Thus particles in the nodal "traps" move to one side of the process chamber, effecting a reduction in particulate contamination in the center. The frequency of the acoustic standing wave is chosen to minimize the transduction impedance and to maximize the gettering of suspended particles at the nodes. Similarly, the rate of phase advancement/retardation is chosen so that particulate contamination of a particular mass distribution travels optimally with the moving nodes.

3. Radiation Pressure

In this method, momentum transfer to particles in the plasma results from directing an energy source such as a laser, high power lamp, or particle beam, across the tool. Radiation pressure, or momentum transfer from particle beams will have effect only on particulates in the plasma and will have little or no effect on gaseous components of the plasma. The concept is similar to that disclosed earlier, i.e., "pushing" any suspended particles out from the center of the tool to the non-critical outer regions. A pulsed or continuous-wave laser may be used and it would be most advantageous to raster the beam across the critical regions of the tool.

Method 3

Abort the Growth or Clustering of Negative Ions

This method and apparatus for plasma particulate contamination control by the discharge interruption portion of this application, concerns a means of inhibiting the nucleation and growth mechanism for chemically-induced contamination. This is done by interrupting the discharge continuity or by changing the chemistry of the discharge to one less prone to negative ion formation and hence less prone to clustering. By repeatedly blocking growth and accumulation of the particles, particle deposition problems can be effectively inhibited, without requiring major changes to either the etch process or the tooling.

Selwyn et al, above, describes the concentration of negative ions in the plasma sheath regions and the trapping of plasma negative ions.

U.S. Pat. No. 4,401,507 of Engle for "Method and Apparatus for Achieving Spatially Uniform Externally Excited Non-Thermal Chemical Reactions" describes turning off an RF modulator for 267 ms with excitation lasting for only 87 ms. The purpose is to allow sufficient time for reactants to move through the chamber, which teaches away from the current process, and which involves a greatly different duty cycle for pulsing.

U.S. Pat. No. 4,500,563 of Ellenberger for "Independently Variably Controlled Pulsed R. F. Plasma Chemical Vapor Processing" uses RF power pulses generated by an on/off switch to produce pulsed RF power, with a pulse repetition rate of 6,000 Hz, and a pulse width of 0.05 ms, in the example, which is believed to refer to the pulse duration Tp in the second figure of the Ellenberger patent. That is a very brief delay. At 6,000 HZ, the repetition rate period is 0.17 ms so that the time the RF is switched off would be as follows:

$$0.17 ms - 0.05 ms = 0.12 ms$$

as contrasted with our 100 ms, which is three orders of magnitude greater. The Ellenberger patent also describes the need for interleaved electrodes which would not apply to the current invention. This invention requires only a single RF electrode or a set of RF electrodes with one or many silicon wafers exposed during the process.

Particular Description of Contamination Control by Discharge Interruption

Figure 3:
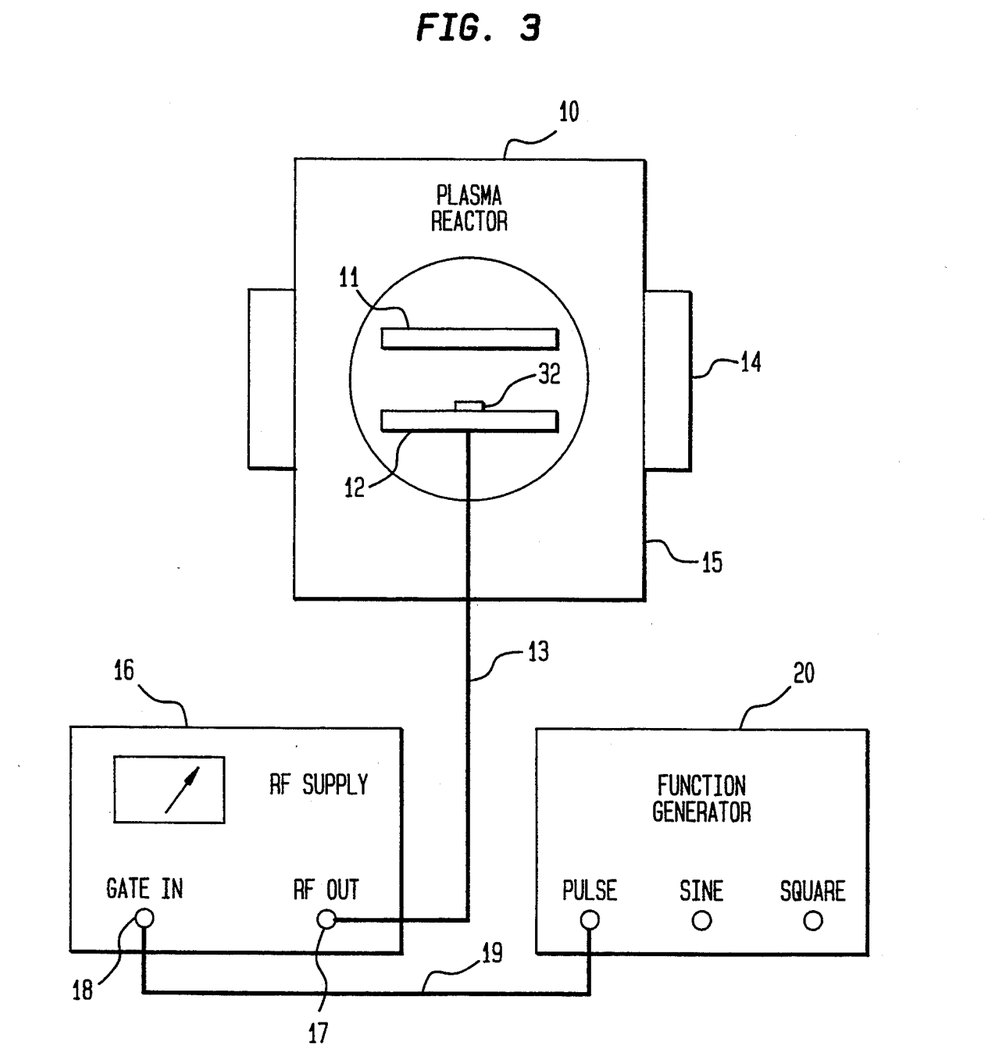
FIG. 3 is a plasma reactor system including control electronics for producing pulses for pulsing the source of RF voltage to the system to prevent the formation of particles within the reactor by periodically interrupting the presence of the plasma within the reactor system.

This aspect of the invention relates to apparatus and methods for inhibiting particle contamination in plasma processing by repeated interruption of the discharge in a plasma reactor. FIG. 3 shows a plasma reactor 10 connected to the RF output voltage from an RF supply unit 16 by means of electrical wire 13 to the electrode 12 of the reactor from the RF output "rf out" terminal 17 of RF supply unit 16. RF supply unit 16 receives electrical control pulses at the time of pulse T(off) in FIG. 4. Those electrical control pulses are supplied from function generator 20 via line 19 to the "gate in" terminal 18 of the RF supply unit 16. In this technique, instead of operating an RF discharge in reactor 10 continuously until the etch or deposition step is completed, the applied RF output voltage on wire 13 and electrode 12 is briefly interrupted periodically as the result of pulses on line 19 to gate 18, resulting in a momentary but complete stoppage of the discharge in reactor 10. The interruption of the plasma is repeated until the process step is completed. The inventors hypothesize that this method inhibits particle growth because each time the discharge is interrupted, the electrostatic field which traps negative ions and charged particles is dissipated as a result. Negative ions, clusters and charged particles are then free to be swept out with the gas flow from reactor 10 through its exhaust line (not shown) of the kind well known to those skilled in the art. When particles drop down onto each wafer 32 on electrode 12 during the discharge interruption, if the RF voltage on wire 13 and electrode 12 is interrupted frequently enough, then the particles will be sufficiently small (less than about 0.1 um) as contrasted to the larger particles which would have formed otherwise. As a result of this process there is no deleterious effect to the integrated circuit devices being formed on the wafers 32.

Figure 4:
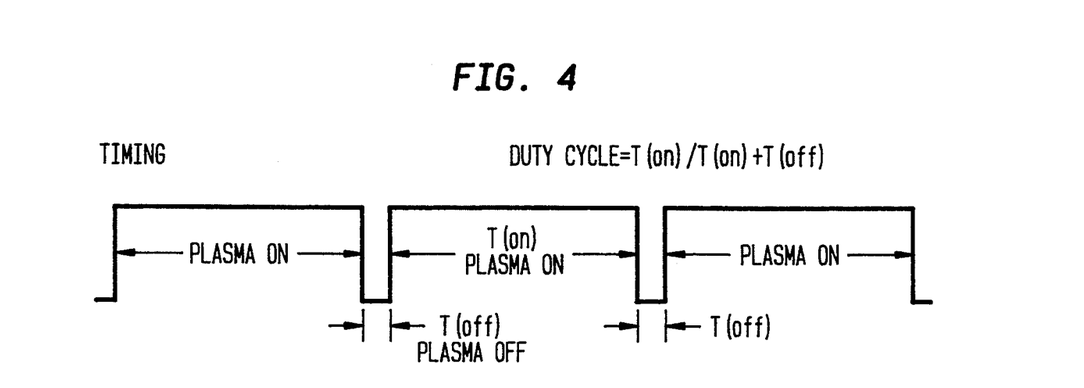
FIG. 4 shows the duty cycle waveform of electrical control pulses for controlling the operation of the plasma reactor system of FIG. 3.

The duty cycle of the pulsed RF plasma discharge in the plasma reactor 10 is shown in FIG. 4. To make this technique as similar as possible in etch or deposition characteristics to the continuous operation of the plasma discharge (which is desirable so as to make maximum use of established process recipes) the plasma duty cycle, or ratio of RF-on time to total time, should be kept high, typically above 0.9. This is not difficult in practice, since our experiments have shown that off-times as short as 0.1 seconds and on-time of 10 seconds per cycle is effective in preventing macroscopic particle growth (duty cycle of 0.99) even over a period of 7 hours of total etch time. Also note for a 40 minute process this duty cycle adds only approximately 24 seconds to the total process time. The best ratio of plasma on-time to plasma off-time depends on the gas residence time in the plasma volume, the pressure, and the extent of negative ion trapping in the discharge. Accordingly, different tools and different etch or deposition steps may require different frequencies for pulsing off the discharge, and different lengths of time which are required for the discharge to be off. A variety of methods can be employed to interrupt the discharge, such as a timing circuit driving an RF switch, a solenoid switch, gated operation of a primary RF supply or even manual switching of the discharge.

It should also be noted that use of small duty cycle discharges (i.e., 50% or less), may show different characteristics such as $Si/SiO_2$ etch selectivity or etch rate, as compared to the same discharge operated continuously. This may result from the persistence of chemical etch removal on the surface during plasma off-time, and the instantaneous cessation of ion bombardment.

This method is simple, effective, inexpensive and easy to retrofit to existing tooling. Of the various methods of inhibiting plasma particle growth, this method is the most universal in application to existing and projected tooling, and should have the least unwanted effects on the process.

In summary, this aspect of the present invention resides in a means to block the mechanism for the formation of charged particulate contamination which results in a plasma chamber, presumably from precursor plasma negative ions. This aspect of the present invention resides in a method of aborting the clustering of negative ions in the plasma to block the formation of particles (method 3, above). Instead of operating the RF discharge continuously, the RF voltage is interrupted briefly and turned back on repeatedly resulting in a momentary but complete stoppage of the discharge periodically. The process of interruption is continued until the process step is completed. The duration for the stoppage is sufficient to allow the dissipation of the electrostatic fields and the dispersion of the charged particulates away from the trapping region near the sheath boundary. In most cases this will be 100-500 milliseconds. The plasma on-time is extended to the maximum time for clustering to occur so as to maintain a high duty cycle and not to extend the process unnecessarily. In most cases this will be 1-10 seconds. Note that in some cases, the discharge is operated continuously for a period of time, until an accumulation of etch products results, and then the discharge is pulsed to prevent particle accumulation.

Plasma interruption may not be effective for mechanical sources of contamination since plasma pulsing may not influence processes in which particle growth does not occur. One example of mechanically-induced contamination occurs in the quartz sputter deposition process. In this process, it is known that quartz flakes drop off tool surfaces, thereby contaminating the wafers. No method is presently available for gettering quartz contamination in this tool, or others, once the contamination is generated. For mechanical sources of contamination such as this another approach is required, such as method 4 described below and method 2 described above. In addition, it is necessary that the control technique does not alter the process parameters such as etch rate, selectivity, or uniformity.

Method 4

Reduce the Introduction of Nucleation Sites Into the Plasma by Chemical or Physical Means As described above, the by-product film that forms on the inner surfaces of the plasma tools can be a source of particulate contamination. An effective method of tool cleaning would eliminate this contamination source. The tool cleaning method should be fast for rapid turn-around of the tool, efficient for removal of deposition material, and have minimal impact, if any, on product wafers. In addition, it is advantageous if the method is inexpensive to use and simple enough for routine use. The method of tool cleaning in accordance with this aspect of the invention meets these requirements. Further, a method of purifying feedgas from gaseous components prone to particulate formation is also described.

Plasma Process Control by Wave Induction

Chemical sources result from the interaction of etch products or reactants with charged or neutral components of the plasma. Such particles will often show size growth with increasing exposure time to the plasma. The aspects of this invention discussed above with reference to FIGS. 3 and 4 pertain to a means of inhibiting the nucleation and growth mechanism for chemically-induced contamination. This is done by interrupting the discharge continuity or by changing the chemistry of the discharge to one less prone to negative ion formation and hence less prone to clustering.

Process Contamination Control by Stress Induction

Figure 5:
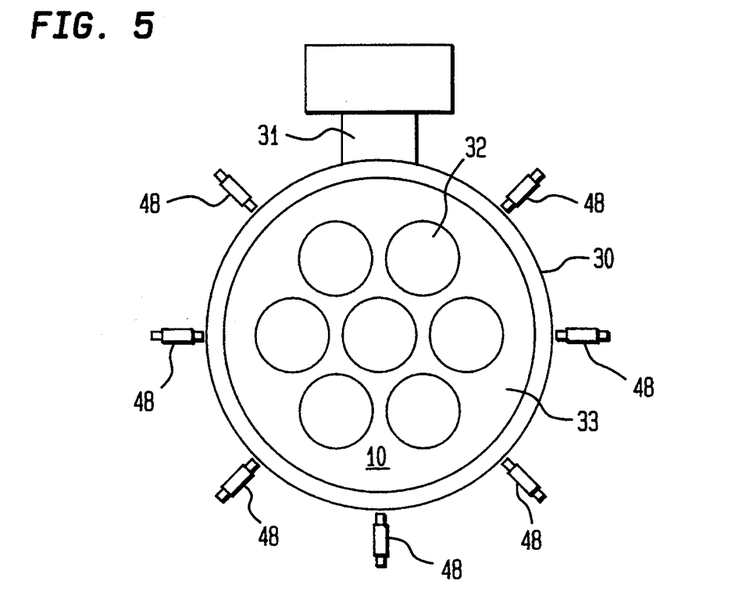
FIG. 5 shows mechanical stress points in a plasma tool employing mechanical shock waves to remove contamination from the interior of the reactor. The plasma reactor system is otherwise similar to the system of FIG. 1, in which a mechanically induced shockwave is propagated throughout the plasma tool within the plasma chamber, typically by striking the chamber wall with a metallic instrument.
Figure 6:
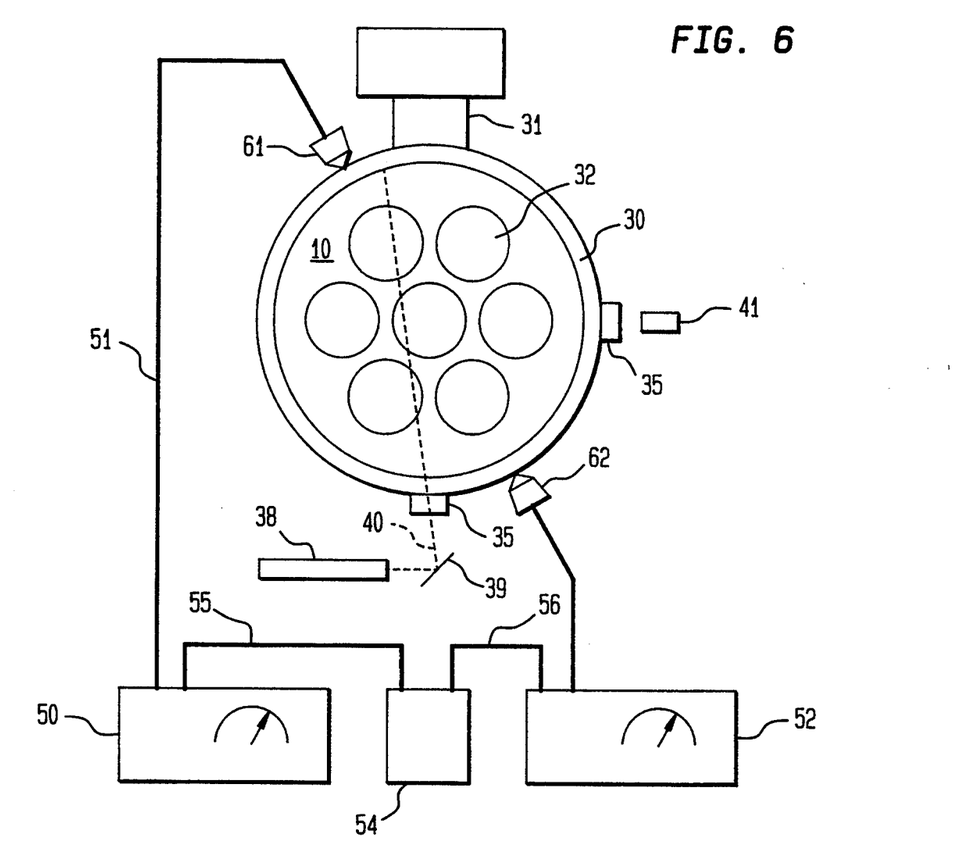
FIG. 6 shows acoustic transducers applied to a plasma tool.
Figure 7:
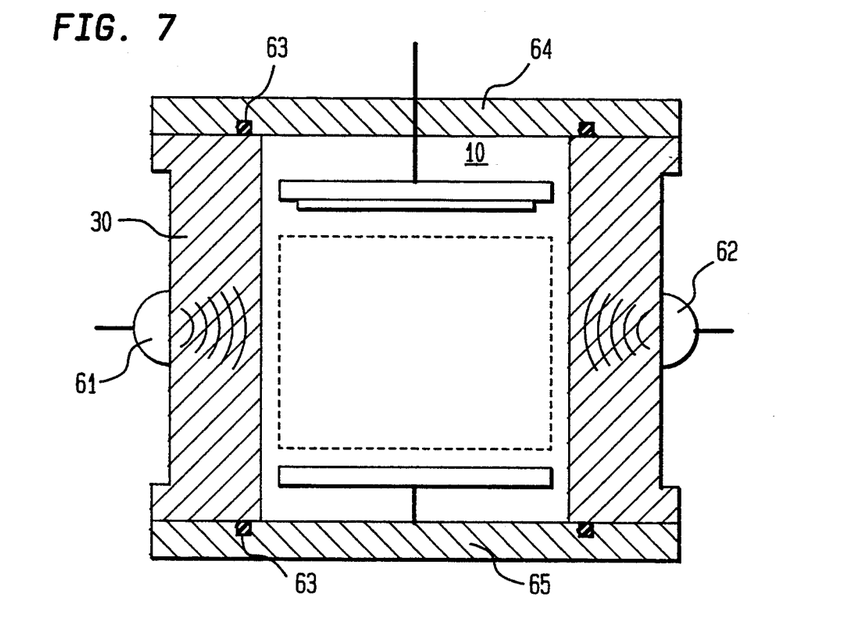

Referring to the embodiments of FIGS. 5–7, stress induction as illustrated by these embodiments can provide efficient removal of deposition material on tool surfaces prior to product process exposure through the use of an external stress applied to the tool. Such stress can be in the form of a mechanical force applied to the tool in the broadest sense as illustrated by the six (6) items listed below. This results in improved contamination control during product exposure.

This aspect of the invention resides in the application of an external stress to the tool at a time between product runs (no workpieces such as wafers or substrates in tool). The applied stress is sufficient to cause fracture of the deposition layer on the tool surfaces and causes flakes or particles resulting from fissure of the deposition film, to drop off into the vacuum or plasma. The efficiency and endpoint for the applied stress may be determined, at the discretion of the engineer, by laser light scattering, using a pulsed or continuous laser source. The laser may be as simple as, but is not limited to, a HeNe laser. Following a period of applied stress, the tool is pumped out (if a plasma is used, the glow is first discontinued), vented, opened and flaked or particulate material is cleaned from the lower electrode and other surfaces. A burst of filtered air or nitrogen, or a vacuum cleaner may be used for removal of deposition debris while the vented tool is open. Following this procedure, the tool can then be used for product runs.

Methods of Applied Stress

Methods of applying stress in accordance with this invention are as follows:
1) Mechanical Shockwave,
2) Acoustic Stress,
3) Ultrasonic Stress,
4) Vibrational Stress,
5) Thermal Stress, and
6) Pressure Stress.

FIGS. 5, 6 and 7 illustrate features of this invention relating to use of mechanical vibrations to remove contamination from a reactor chamber. FIG. 5 shows mechanical stress points applied to a plasma tool. FIG. 6 shows acoustic transducers applied to a plasma tool.

Mechanical Shockwave

In the mechanical shockwave approach, shown in FIG. 5, where like parts have like identifications to those in FIG. 1, a light shockwave is propagated throughout the plasma tool within chamber wall 30, typically by striking the chamber wall 30 with a metal instrument, such as one of the electromagnetically actuated hammers 48 shown in FIG. 5. This technique may be most effective if done during plasma operation. Experience with this technique indicates 10–12 strikes on chamber wall 30 by hammers 48 with a force of 4–5 ounces over an area of 1 cm² is generally sufficient for plasma deposition tools which deposit on wafers 32. In the particular case of quartz plasma deposition tools, copious flaking of quartz material was observed during argon plasma operation (without any wafers, i.e. without product in the tool) as a result of stress induction.

Figure 10:
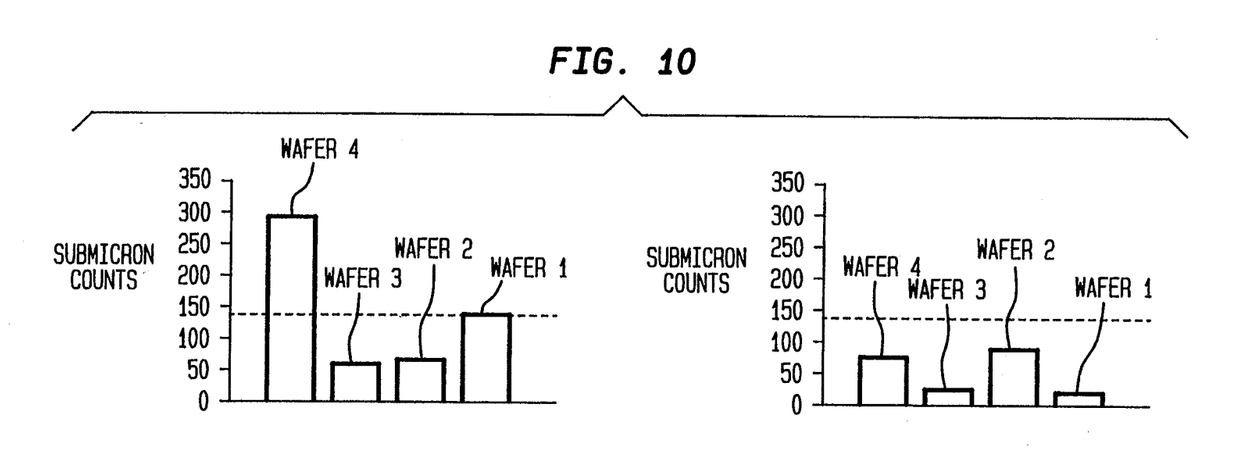
FIG. 10 and FIG. 11 show measurements of particle counts before and after tapping a reactor chamber.
Figure 11:
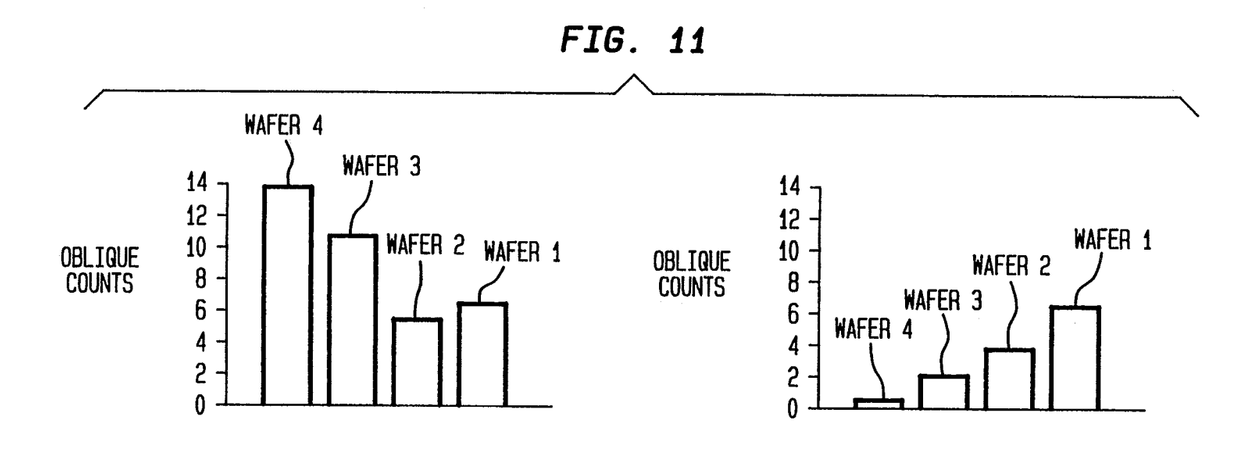

FIG. 10 and FIG. 11 show measurements of particle counts before and after tapping a reactor chamber. Wafer 4 in each case is closest to the point where tapping or hammering occurred and wafer 1 is farthest away. FIG. 10 shows the submicron particle counts and FIG. 11 shows the counts for the particles which are of the order of 2 microns in minimum size. The dashed line is a measurement standard. The results such as those shown in FIG. 10 on the right, after tapping, is 50% to 70% reduction from the pretapping results over a number of runs. As can be seen the results here shown vary between 60% and 70% reduction, which is slightly better than the average. The results are similarly improved in FIG. 11 for the larger particles, but they are much more improved nearest to the site of tapping as can be seen with the minuscule count on wafer 4 and the unchanged reading for wafer 1.

Acoustic Stress

In the acoustic stress approach, shown in FIGS. 6 and 7, the tools are subjected to acoustic frequencies either at atmospheric pressure or at the reduced pressure of process operation. An acoustic transducer in the form of a speaker or equivalent acoustic transducer 61 or 62 may be applied internally or external to the chamber wall 30 of a plasma processing tool. This approach may be most efficient if followed immediately by plasma operation without wafers in the tool. The tool shown in FIG. 6 includes a power supply 50 and lead lines 51 for acoustic transducer 61 and a power supply 52 and acoustic lines 53 for acoustic transducer 62. A pulse generator 54 is connected by lines 55 and: 56 to the power supplies 50 and 52 to generate the acoustic signals which energize the acoustic transducer 61 and 62. The tool shown in FIG. 7 includes upper wall 64 and bottom wall 65 sealed to the chamber side wall 60 by means of O-rings 63.

Ultrasonic Stress

In the ultrasonic stress approach (similar to the acoustic method described above), the tool is subjected to ultrasonic frequencies where the transducers 61 and 62 are ultrasonic transducers. These frequencies may be matched to critical frequencies of the deposition material (such as quartz).

Vibrational Stress

In this approach, the entire tool is subjected to a regular or irregular vibration to loosen material which is ready to flake off.

Thermal Stress

In this approach, heater coils are built into tool components which are especially prone to deposition coverage and flaking, such as the RF ground rings or wall liner in quartz tools. These heaters may be current flashed for rapid heating in between product runs. Rapid heating causes expansion stress between the metal rings and the deposited film because of different coefficients of thermal expansion for the two materials. During product runs, these heaters may also be used to maintain a constant temperature, thereby avoiding thermal stress during product exposure when flaking is especially undesirable.

Pressure Stress

In this approach, the tool in FIGS. 6 and 7 is pressurized above atmospheric pressure using an inert gas such as argon or nitrogen employing conventional sources of pressurized gases, as will be well understood by those skilled in the art. This superambient pressure is released suddenly through a valve into a vented exhaust line. The change in internal pressure causes a slight deformation of the tool chamber side wall 30, which is accompanied by a gas shock wave. The mechanical stress along with the gas shock wave enhances fracture of deposition films on the walls 30, 64 and 65 in FIGS. 6 and 7.

Rapid gas flow out of the tool into the exhaust line also carries off particles and/or flakes away from the interior tool surfaces of walls 30, 64 and 65.

These methods can be used singularly or combined to enhance film stress. Laser light scattering with laser beam 40 as described above can be used to determine the effectiveness of stress induction, and to determine when the tool is sufficiently clean for manufacturing use. Using these approaches, existing tooling can operate more cleanly and with less variability in contamination. Effectiveness of the schockwave method has been demonstrated on a quartz deposition tool as shown in FIGS. 10 and 11.

Process Contamination Control by Process Gas Addition and Reactive Filtering

Figure 8:
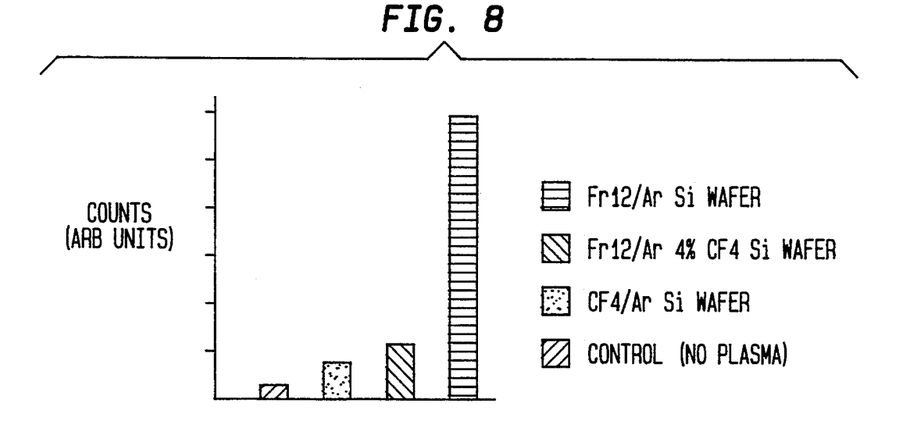
FIGS. 8 is a graph of the particle counts as a function of various gases employed in a plasma chamber shown in FIG. 9.
Figure 9:
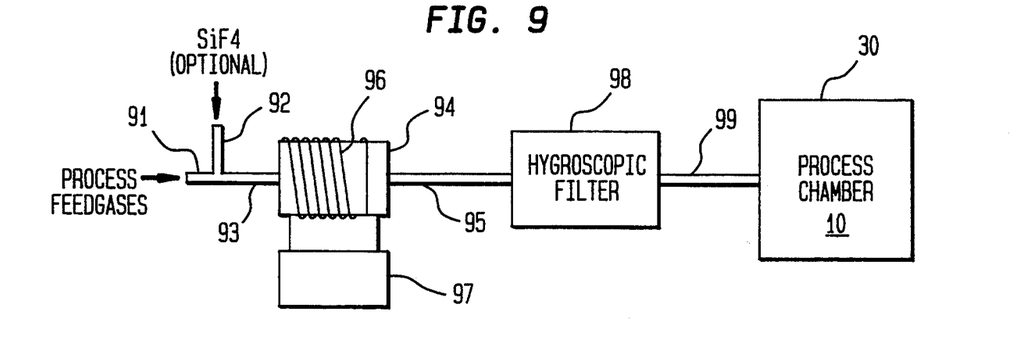
FIG. 9 shows a design of an inductively-coupled pre-process contamination filter attached to the plasma reactor chamber.

FIG. 8 is a graph showing the effect of adding $CF_4$ in trace quantities to a typical process plasma (Freon 12/AR) ($CCl_2F_2$/Ar) on the particulate contamination found on the wafer after processing. FIG. 9 shows a design of an optional inductively-coupled pre-process contamination chamber 94 and a hygroscopic filter 98. The chamber 94 and filter 98 are connected in the feed gas supply line to the plasma reactor chamber 10.

This aspect of this invention comprises a method for reducing particulate contamination levels resulting as follows:
1) plasma processes containing chlorinated compounds and polymeric precursors such as carbon or sulfur, or
2) plasma processes where $SiF_4$ is a major plasma constituent and the process provides high etch selectivity of Si with respect to mask surfaces such as $SiO_2$.

In accordance with this aspect of the invention a method is provided for prevention of the formation of particulates in a plasma processing chamber 10 defined by walls 30 in FIG. 9. Process feed gases are supplied by conduit 91 to conduit 93 which is connected to the inlet of inductive chamber 94 which removes particles from the feed gases. From the chamber 94 the cleaned gases pass through conduit 95 to the inlet of hygroscopic filter 98 which removes water vapor from the feed gases. Filter 98 has an outlet for supplying the filtered and drier gases through line 99 to the plasma processing reactor chamber 10.

Chamber 94 is wound with a helical, electromagnetic inductive coil 96 connected to an electrical A.C. power supply 97 for energizing the coil 96. For the first category of processes, the plasma gases are modified by the addition of small amounts (i.e., approximately 5%) of fluorinated gases such as $NF_3$ or $CF_4$ to the process feed gases supplied to conduit 91. We have experimentally observed that the addition to the gases supplied in conduit 91 of such small amounts of $CF_4$ drastically reduces particulate contamination in the plasma and on the wafers without adversely affecting the etch process.

FIG. 8 shows the effectiveness of addition of 4% $CF_4$ on wafer spot counts. Pure fluorine may also be used but would be less desirable for health and safety reasons. For comparison purposes contamination levels are shown for a $CF_4$/argon plasma during silicon etching and contamination resulting from a pump and vent operation in the tool (no plasma.)

In the second category of processes there are two methods of preventing particle formation. The first is to minimize oxygen or water formation during plasma processing. The release of oxygen or water in the plasma may result from interaction of the plasma with the chamber walls 30 of reactor 10. We employ a method of pre-process chamber conditioning using a plasma of $CF_4$ or $NF_3$ before device processing. Exposure of the walls 30 of chamber 10 to either of these plasmas would assist the displacement and volatilization of absorbed oxygen, as well as absorbed alcohols or water in the form of CO or NO, and HF.

The second method minimizes moisture content or chemical formation of water in process feed gases. Another aspect of this invention is to employ the method of reactive filtration of the feed gases before their introduction to the process chamber in inductive chamber 94. In one embodiment, trace amounts of $SiF_4$ are added in line 92 to the process feedgases. $SiF_4$ reactively getters the moisture content in the process feed gas. This mixture flows through a silica gel filter 98 prior to entering the plasma chamber 10. The filter 98 removes silicon oxide particulates which result from the chemical reaction between $SiF_4$ and $H_2O$.

In a second embodiment, an inductive plasma induced by the coil 96 when energized by power supply 97 is applied to the chamber 94 to remove water formed by fragmentation of hydrogenous components such as $H_2$ or hydrocarbon impurities in feed gases. This method is used to selectively remove impurities which may form water once exposed to a plasma. Any moisture formed is removed by reaction with $SiF_4$ and is absorbed by the silica gel in filter 98.

INDUSTRIAL APPLICABILITY

This invention is applicable in manufacturing of electronic components such as integrated circuit chips for use in electronic circuits in devices such as personal computers, minicomputers, large scale computers and other data processing equipment. In addition, this system and process will be applicable to industrial and consumer electronic devices employing such chips.

What is claimed is:

1. A method for prevention of plasma contamination in a plasma reactor system comprising performing a plasma process including the steps as follows:
   a) applying an RF voltage to establish a plasma within said reactor,
   b) periodically interrupting said RF voltage for a brief interval and reestablishing said RF voltage after said brief interval, providing a series momentary interruptions of said RF voltage and said plasma periodically, between longer periods of time during which said RF voltage is applied causing said plasma to be applied in said reactor during said longer periods, and
   c) continuously repeating the application of said RF voltage to said reactor interrupted by said brief intervals of interruption of said RF voltage until the completion of said plasma process whereby elimination of particle contamination situ in said plasma reactor system is achieved.

2. A method of prevention of plasma contamination in a plasma reactor system comprising
   applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor wherein said standing waves comprise electromagnetic waves, and wherein said standing electromagnetic waves have a controllable phase shift.

3. A method of prevention of plasma contamination in a plasma reactor system comprising applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor wherein said standing waves comprise electromagnetic waves, and wherein said standing electromagnetic waves comprise a microwave field having a controllable phase shift from opposite regions of said reactor.

4. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of a directed acoustic wave.

5. A method of prevention of plasma contamination in a plasma reactor system including applying energizing means selected from electrostatic, electromagnetic, mechanical, thermal, pressure, hygroscopic and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of a standing acoustic wave.

6. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of an acoustic wave generated by a transducer.

7. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of an acoustic wave generated by a pulsed gas flux in the tool.

8. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of a standing acoustic wave generated by two transducers located on opposite sides of said reactor.

9. A method of prevention of plasma contamination in a plasma reactor system including applying energizing means selected from electrostatic, electromagnetic, mechanical, thermals, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of particle beams.

10. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active region of said reactor, comprising moving particle contamination across said plasma reactor to reduce contamination by the use of electromagnetic radiation pressure.

11. A method in accordance with claim 10 wherein said electromagnetic radiation pressure comprises light from a source selected from lasers and incoherent light sources.

12. A method of prevention of plasma contamination in a plasma reactor system including applying energizing means selected from electrostatic, electromagnetic, mechanical, thermal, pressure, hygroscopic, and chemical means to eliminate particle contamination in situ in said plasma reactor system said forces being applied within said reactor for moving particles potentially leading to contamination across said plasma reactor to a space separate from the active region of said reactor to reduce contamination within said active reactors.

comprising moving particle contamination across said plasma reactor to reduce contamination by the use of a thermal gradient.

13. A method for performing a plasma process including the steps as follows:
a) loading a work pica into an RF plasma chamber,
b) applying an RF voltage to establish a plasma within said chamber, said plasma being exposed to said work pica to perform a plasma process upon at least one surface of said work piece,
c) periodically interrupting said RF voltage for a brief interval and reestablishing said RF voltage after said brief interval, providing a series of momentary interruptions of said RF voltage and said plasma periodically, between longer periods of time during which said RF voltage is applied causing said plasma to be applied to said work piece during said longer periods, and
d) continuously repeating the application of said RF voltage to said chamber interrupted by said brief intervals of interruption of said RF voltage until the completion of said plasma process.

14. A method of prevention of plasma contamination in a plasma reactor system comprising:
applying energizing means selected from electrostatic, electromagnetic, mechanical, thermal, pressure, hygroscopic, and chemical means to eliminate particle contamination in situ in said plasma reactor system of reducing water content of process feed gas by the use of a hygroscopic filter prior to entering the process chamber,
said method including reducing water content of process feed gas by the use of a silica gel filter prior to entering the process chamber.

15. A method of prevention of plasma contamination in a plasma reactor system comprising:
applying energizing means selected from electrostatic, electromagnetic, mechanical, thermal, pressure, hygroscopic, and chemical means to eliminate particle contamination in situ in said plasma reactor system of reducing water content of process feed gas by the use of a hygroscopic filter prior to entering the process chamber,
said method including reducing water content of process feed gas by the mixture of small amounts of $SiF_4$ with the process gases, before a silica gel filter prior to entering the process chamber.

16. A method in accordance with claim 15 comprising mixing into the feed gas a mixture of small amounts of $SiF_4$ with the process gases, in the presence of an inductive plasma in said silica gel filter prior to introduction of the feed gases into the processing chamber, whereby the water and hydrogenous material content in said feed gas is reduced.

17. Apparatus for prevention of plasma contamination in a plasma reactor system including
decontamination means selected from means for applying electrostatic, electromagnetic, mechanical, thermal, pressure, hygroscopic and chemical means to eliminate particle contamination in situ in said plasma reactor system,
said means for decontamination providing said forces,
said forces being applied within said reactor for moving particles potentially leading to contamination across said plasma reactor to a space separate from the active region of said reactor to reduce contamination within said active region of said reactor,
said decontamination means comprising means for moving particle contamination across a plasma reactor to reduce contamination by the use of a directed acoustic wave.

18. Apparatus for prevention of plasma contamination in a plasma reactor system including:
decontamination means selected from means for applying electrostatic, electromagnetic, mechanical, thermal, pressure, hygroscopic and chemical means to eliminate particle contamination in situ in said plasma reactor system,
said means for decontamination providing said forces,
said forces being applied within said reactor for moving particles potentially leading to contamination across said plasma reactor to a space separate from the active region of said reactor to reduce contamination within said active region of said reactor,
said decontamination means comprising means for moving particle contamination across a plasma reactor to reduce contamination by the use of a directed acoustic wave.

19. Apparatus for prevention of plasma contamination in a plasma reactor system including
decontamination means selected from means for applying electrostatic, electromagnetic, mechanical, thermal, pressure, hygroscopic and chemical means to eliminate particle contamination in situ in said plasma reactor system,
said means for decontamination providing said forces,
said forces being applied within said reactor for moving particles potentially leading to contamination across said plasma reactor to a space separate from the active region of said reactor to reduce contamination within said active region of said reactor,
said decontamination means comprising means for moving particle contamination across a plasma reactor to reduce contamination by the use of an acoustic wave generated by a transducer.

20. Apparatus for prevention of plasma contamination in a plasma reactor system including
decontamination means selected from means for applying electrostatic, electromagnetic, mechanical, thermal, pressure, hygroscopic and chemical means to eliminate particle contamination in situ in said plasma reactor system,
said means for decontamination providing said forces,
said forces being applied within said reactor for moving particles potentially leading to contamination across said plasma reactor to a space separate from the active region of said reactor to reduce contamination within said active region of said reactor,
said decontamination means comprising means for moving particle contamination across a plasma reactor to reduce contamination by the use of an acoustic wave generated by a pulsed gas flux in the tool.

21. Apparatus for prevention of plasma contamination in a plasma reactor system including
decontamination means selected from means for applying electrostatic, electromagnetic, mechanical, thermal, pressure, hygroscopic and chemical means to eliminate particle contamination in situ in said plasma reactor system, said means for decontamination providing said forces, said forces being applied within said reactor for moving particles potentially leading to contamination across said plasma reactor to a space separate from the active region of said reactor to reduce contamination within said active region of said reactor, said decontamination means comprising means for moving particle contamination across a plasma reactor to reduce contamination by the use of a standing acoustic wave generated by two transducers located on opposite sides of said reactor.

22. Apparatus for prevention of plasma contamination in a plasma reactor system including decontamination means selected from means for applying electrostatic, electromagnetic, mechanical, thermal, pressure, hygroscopic and chemical means to eliminate particle contamination in situ in said plasma reactor system, said means for decontamination providing said forces, said forces being applied within said reactor for moving particles potentially leading to contamination across said plasma reactor to a space separate from the active region of said reactor to reduce contamination within said active region of said reactor, said decontamination means comprising means for moving particle contamination across said plasma reactor to reduce contamination by the use of particle beams.

23. Apparatus for prevention of plasma contamination in a plasma reactor system including decontamination means selected from means for applying electrostatic, electromagnetic, mechanical, thermal, pressure, hygroscopic and chemical means to eliminate particle contamination in situ in said plasma reactor system, said means for decontamination providing said forces, said forces being applied within said reactor for moving particles potentially leading to contamination across said plasma reactor to a space separate from the active region of said reactor to reduce contamination within said active region of said reactor, said decontamination means comprising means for moving particle contamination across said plasma reactor to reduce contamination by the use of electromagnetic radiation pressure.

24. Apparatus in accordance with claim 23 wherein said electromagnetic radiation pressure comprises light from light sources selected from lasers and incoherent light sources.

25. Apparatus for prevention of plasma contamination in a plasma reactor system including decontamination means selected from means for applying electrostatic, electromagnetic, mechanical, thermal, pressure, hygroscopic and chemical means to eliminate particle contamination in situ in said plasma reactor system, said means for decontamination providing said forces, said forces being applied within said reactor for moving particles potentially leading to contamination across said plasma reactor to a space separate from the active region of said reactor to reduce contamination within said active region of said reactor, said decontamination means comprising means for moving particle contamination across a plasma reactor to reduce contamination by the use of a thermal gradient.

26. Apparatus for performing a plasma process including a) means for loading a work piece into an RF plasma chamber, b) means for applying an RF voltage to establish a plasma within said chamber, said plasma being exposed to said work piece to perform a plasma process upon at least one surface of said work piece, c) means for periodically interrupting said RF voltage for a brief interval and reestablishing said RF voltage after said brief interval, providing a series of momentary interruptions of said RF voltage and said plasma periodically, between longer periods of time during which said RF voltage is applied causing said plasma to be applied to said work piece during said longer periods, and d) means for continuously repeating the application of said RF voltage to said chamber interrupted by said brief intervals of interruption of said RF voltage until the completion of said plasma process.

27. Apparatus for prevention of plasma contamination in a plasma reactor system comprising decontamination means selected from means for applying electrostatic, electromagnetic, mechanical, thermal, pressure, hygroscopic and chemical means to eliminate particle contamination in situ in said plasma reactor system, and means for reducing contamination selected from water, oxygen and absorbed organic chemicals from the interiors of said reactor with a pre-process plasma exposure with a reactive gas, said decontamination means comprising means for pre-process exposure of $CF_4$ or $NF_3$ plasmas whereby reduction in the contamination selected from water, oxygen and absorbed organic chemicals from the interiors of plasma chambers is achieved.

28. Apparatus for prevention of plasma contamination in a plasma reactor system comprising decontamination means selected from means for applying electrostatic, electromagnetic, mechanical, thermal, pressure, hygroscopic and chemical means to eliminate particle contamination in situ in said plasma reactor system, and means for reducing water content of process feed gas by the use of a hygroscopic filter prior to entering the process chamber.

29. Apparatus in accordance with claim 28 wherein said means for reducing water content of process feed gas comprises a silica gel filter prior to entering the process chamber.

30. Apparatus in accordance with claim 29 wherein said means for reducing water content of process feed gas comprises a dessicating space housing a mixture of small amounts of $SiF_4$ with the process gases, said dessicating space being located before said silica gel filter prior to entering said process chamber.

31. Apparatus in accordance with claim 28 for prevention of plasma contamination in a plasma reactor system comprising decontamination means selected from means for applying electrostatic, electromagnetic, mechanical, thermal, pressure, hygroscopic and chemical means to eliminate particle contamination in situ in said plasma reactor system, and means for reducing contamination selected from water, oxygen and absorbed organic chemicals from interiors of said reactor with a pre-process plasma exposure with a reactive gas, said decontamination means comprising said dessicating space containing a feed gas mixture comprising small amounts of $SiF_4$ with the process gases, and means for providing an inductive plasma prior to introduction of the feed gases into the processing chamber, whereby the water and hydrogenous material content of said feed gas is reduced.

32. Apparatus for prevention of plasma contamination in a plasma reactor system comprising decontamination means selected from means for applying electrostatic, electromagnetic, mechanical, thermal, pressure, hygroscopic and chemical means to eliminate particle contamination in situ in said plasma reactor system including a) means for exposing said reactor to a coherent light source for producing in situ light scattering in said reactor, and b) means for detecting said light scattering within said reactor, whereby contamination inside said reactor can be measured by analyzing said light scattering.

* * * * *